(12) United States Patent
Sugrim et al.

(10) Patent No.: US 10,732,118 B2
(45) Date of Patent: Aug. 4, 2020

(54) GAS DETECTOR WITH HYPERDOPED SIC SEMICONDUCTOR MATERIAL AND RELATED METHODS

(71) Applicants: UNIVERSITY OF CENTRAL FLORIDA RESEARCH FOUNDATION, INC., Orlando, FL (US); THE U.S.A. AS REPRESENTED BY THE SECRETARY OF THE NAVY, Arlington, VA (US)

(72) Inventors: Chandraika Sugrim, Saint Augustine, FL (US); Ranganathan Kumar, Chulota, FL (US); Aravinda Kar, Orlando, FL (US); Robert Burkhart, Saint Johns, FL (US)

(73) Assignees: UNIVERSITY OF CENTRAL FLORIDA RESEARCH FOUNDATION, INC., Orlando, FL (US); THE U.S.A. AS REPRESENTED BY THE SECRETARY OF THE NAVY, Arlington, VA (US)

( * ) Notice: Subject to any disclaimer, the term of this patent is extended or adjusted under 35 U.S.C. 154(b) by 0 days.

(21) Appl. No.: 16/597,277

(22) Filed: Oct. 9, 2019

(65) Prior Publication Data

US 2020/0110034 A1 Apr. 9, 2020

Related U.S. Application Data

(60) Provisional application No. 62/743,072, filed on Oct. 9, 2018.

(51) Int. Cl.
*G01N 21/76* (2006.01)
*H01L 27/146* (2006.01)
(Continued)

(52) U.S. Cl.
CPC ..... *G01N 21/766* (2013.01); *H01L 27/14601* (2013.01); *H01L 27/14643* (2013.01);
(Continued)

(58) Field of Classification Search
None
See application file for complete search history.

(56) References Cited

U.S. PATENT DOCUMENTS 4,810,658 A * 3/1989 Shanks .................. G01N 21/03
250/227.31
8,206,651 B2 * 6/2012 Maurer .............. G01N 21/6486
422/66

(Continued)

OTHER PUBLICATIONS

Sullivan et al. "Methodology for vetting heavily doped semiconductors for intermediate band photovoltaics: A case study in sulfur-hyperdoped silicon" Journal of Applied Physics 114 (10): 103701. doi:10.1063/1.4820454. pp. 10.

(Continued)

*Primary Examiner* — Daniel S Larkin
(74) *Attorney, Agent, or Firm* — Allen, Dyer, Doppelt + Gilchrist, PA

(57) ABSTRACT

A detector is for identifying chemicals in a sample. The detector may include a photodetector comprising SiC semiconductor material and configured to have an acceptor energy band of range $E_a - \Delta E_a$ to $E_a + \Delta E_a$. The SiC semiconductor material may be doped with a dopant to exceed a threshold dopant concentration level. The photodetector may be configured to receive fluorescence information from the sample.

22 Claims, 13 Drawing Sheets

(51) Int. Cl.
  *H01S 5/00* (2006.01)
  *H01S 5/026* (2006.01)
(52) U.S. Cl.
  CPC .......... *H01S 5/0028* (2013.01); *H01S 5/0262* (2013.01); *G01N 2201/0612* (2013.01)

(56) References Cited

U.S. PATENT DOCUMENTS

| | | |
|---|---|---|
| 9,164,035 B2 | 10/2015 | Sugrim et al. |
| 9,570,487 B2 | 2/2017 | Manzur et al. |
| 9,601,902 B2 | 3/2017 | Kar et al. |
| 2004/0007675 A1* | 1/2004 | Gillispie ............... G01J 3/4406 250/458.1 |
| 2012/0051378 A1 | 3/2012 | Kar et al. |

OTHER PUBLICATIONS

Lin et al. "Uncooled SiC MWIR detector based on optical signal" 2011 IEEE Photonics Society Summer Topical Meeting Series: Date of Conference: Jul. 18-20, 2011; Abstract Only.

* cited by examiner

GAS DETECTOR WITH HYPERDOPED SIC SEMICONDUCTOR MATERIAL AND RELATED METHODS

RELATED APPLICATION

This application is based upon prior filed Application No. 62/743,072 filed Oct. 9, 2018, the entire subject matter of which is incorporated herein by reference in its entirety.

TECHNICAL FIELD

The present disclosure relates to the field of compound detection, and, more particularly, to gas detectors, and related methods.

BACKGROUND

There are many applications where chemical sensing functionality is helpful. Due to the wide variety of potential applications for chemical sensing, there is a desire to provide an approach that is flexible in packaging demands, and that includes a robust feature set.

For example, one application for chemical detection in a gas sample is an air supply system. In these applications, the chemical detection is used to determine whether containments have been introduced into the air supply.

SUMMARY

Generally speaking, a detector is for identifying chemicals in a sample. The detector may include a photodetector comprising silicon carbide (SiC) semiconductor material and configured to have an acceptor energy band of range $E_a-\Delta E_a$ to $E_a+\Delta E_a$. The SiC semiconductor material may be doped with a dopant to exceed a threshold dopant concentration level. The photodetector may be configured to receive fluorescence information from the sample.

In some embodiments, the detector may include a pump optical source configured to emit a pump optical signal into the sample, and the pump optical signal may have a known modulation. The detector may include a tunable optical source configured to emit a boosting optical signal at the photodetector. The photodetector may be configured to receive the fluorescence information from the sample, the fluorescence information having the known modulation. The tunable optical source is configured to change the acceptor energy band of range to detect a plurality of compounds in the sample. In particular, the pump optical signal may have a known modulation, a known phase, and a known angle of incidence to the sample. For example, the pump optical source may comprise an optical laser source.

Also, the detector may further comprise a probe optical source configured to emit a probe optical signal at the photodetector, a probe photodetector configured to detect a changed probe optical signal from the photodetector, and a processor coupled to the probe photodetector and configured to bandpass filter an output of the probe photodetector, and identify the chemicals in the sample. The detector may also further comprise an optical beam splitter coupled between the probe optical source and the photodetector and the probe photodetector. For example, the probe photodetector may comprise a photodiode.

In some embodiments, the detector may further comprise a multi-core optical fiber including a plurality of cores, each core having a first end, and a second end. Each of the first ends of the plurality of cores may be coupled optically with the photodetector. A first set of the second ends of the plurality of cores may be coupled optically with the probe optical source, and a second set of the second ends of the plurality of cores may be coupled optically with the probe photodetector. The processor may be configured to identify the chemicals and respective distances in the sample based upon a phase shift in the changed probe optical signal.

Another aspect is directed to a detector system for identifying chemicals in a sample. The detector system may include a directional device, and a detector coupled to the directional device. The detector may comprise a pump optical source configured to emit a pump optical signal into the sample. The pump optical signal may have a known modulation, a known phase, and a known angle of incidence to the sample. The detector also may include a photodetector comprising SiC semiconductor material and configured to have an acceptor energy band of range $E_a-\Delta E_a$ to $E_a+\Delta E_a$. The SiC semiconductor material may be doped with a dopant to exceed a threshold dopant concentration level. The photodetector may be configured to receive fluorescence information from the sample, the fluorescence information having the known modulation. The detector may include a probe optical source configured to emit a probe optical signal at the photodetector, a probe photodetector configured to detect a changed probe optical signal from the photodetector, and a processor coupled to the probe photodetector. The processor may be configured to identify the chemicals and respective distances in the sample based upon a phase shift in the changed probe optical signal, and provide a time based three-dimensional model of the sample based upon a known position from the directional device.

Another aspect is directed to a method of making a detector for identifying chemicals in a sample. The method may include forming a photodetector comprising SiC semiconductor material and configured to have an acceptor energy band of range $E_a-\Delta E_a$ to $E_a+\Delta E_a$. The SiC semiconductor material may be doped with a dopant to exceed a threshold dopant concentration level. The photodetector may be configured to receive fluorescence information from the sample.

In some embodiments, the method may also comprise coupling a pump optical source configured to emit a pump optical signal into the sample. The pump optical signal may have a known modulation. The method may include coupling a tunable optical source configured to emit a boosting optical signal at the photodetector. The photodetector may be configured to receive the fluorescence information from the sample, the fluorescence information having the known modulation. The tunable optical source may be configured to change the acceptor energy band of range to detect a plurality of compounds in the sample.

The pump optical source may be configured to emit the pump optical signal into the sample, the pump optical signal having a known modulation, a known phase, and a known angle of incidence to the sample. The pump optical source may comprise an optical laser source, for example. The method may further comprise coupling a probe optical source configured to emit a probe optical signal at the photodetector, coupling a probe photodetector configured to detect a changed probe optical signal from the photodetector, and coupling a processor to the probe photodetector and configured to bandpass filter an output of the probe photodetector, and identify the chemicals in the sample.

In some embodiments, the method may further comprise coupling an optical beam splitter between the probe optical source and the photodetector and the probe photodetector. The probe photodetector may comprise a photodiode, for example. The method may also comprise coupling a multi-core optical fiber including a plurality of cores, each core having a first end, and a second end. Each of the first ends of the plurality of cores may be coupled optically with the photodetector. A first set of the second ends of the plurality of cores may be coupled optically with the probe optical source, and a second set of the second ends of the plurality of cores may be coupled optically with the probe photodetector. The method may also comprise coupling the processor to the probe photodetector and configured to compute sample characteristics in relation to time.

DETAILED DESCRIPTION

Figure 1:
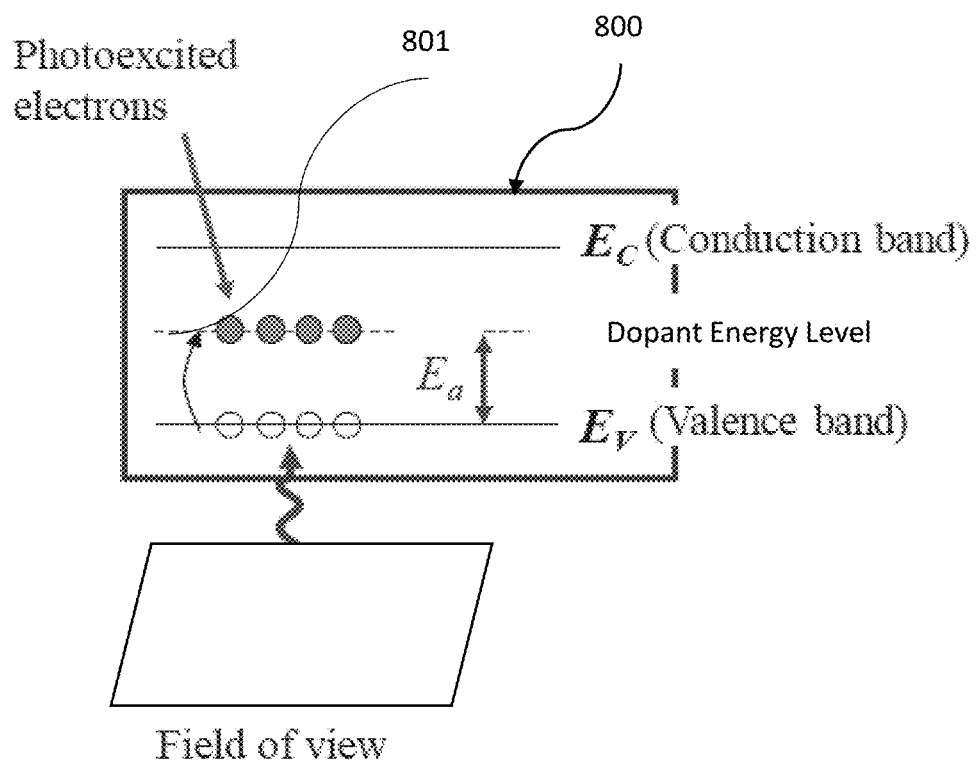
FIG. 1 is a schematic diagram of a SiC photodetector with a low dopant level, according to the prior art.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

Generally speaking, a detector is for identifying chemicals in a sample. The detector may include a photodetector comprising SiC semiconductor material and configured to have an acceptor energy band of range $E_a-\Delta E_a$ to $E_a+\Delta E_a$. The SiC semiconductor material is doped with a dopant to exceed a threshold dopant concentration level. The detector also includes the photodetector configured to receive fluorescence information from the sample.

Another aspect is directed to a detector for identifying chemicals in a sample. The detector may include a pump optical source configured to emit a pump optical signal into the sample, the pump optical signal having a known modulation. The detector also includes a photodetector comprising SiC semiconductor material and configured to have an acceptor energy band of range $E_a-\Delta E_a$ to $E_a+\Delta E_a$. The SiC semiconductor material may be doped with a dopant to exceed a threshold dopant concentration level. The detector also may include a tunable optical source configured to emit a boosting optical signal at the photodetector. The detector also may include the photodetector configured to receive fluorescence information from the sample, the fluorescence information having the known modulation.

Yet another aspect is directed to a detector for identifying chemicals in a sample. The detector may include a pump optical source configured to emit a pump optical signal into the sample, the pump optical signal having a known modulation. The detector also may include a photodetector comprising SiC semiconductor material and configured to have an acceptor energy band of range $E_a-\Delta E_a$ to $E_a+\Delta E_a$. The SiC semiconductor material may be doped with a dopant to exceed a threshold dopant concentration level, and the photodetector may be configured to receive fluorescence information from the sample, the fluorescence information having the known modulation. The detector may also include a probe optical source configured to emit a probe optical signal at the photodetector. The detector may also include a probe photodetector configured to detect a changed probe optical signal from the photodetector, and a processor coupled to the probe photodetector and configured to bandpass filter an output of the probe photodetector, and identify the chemicals in the sample.

Another aspect is directed to a detector for identifying chemicals in a sample. The detector may comprise a pump optical source configured to emit a pump optical signal into the sample, the pump optical signal having a known modulation. The detector also may include a photodetector comprising SiC semiconductor material and configured to have an acceptor energy band of range $E_a-\Delta E_a$ to $E_a+\Delta E_a$. The SiC semiconductor material may be doped with a dopant to exceed a threshold dopant concentration level, and the photodetector may be configured to receive fluorescence information from the sample, the fluorescence information having the known modulation. The detector also may include a probe optical source configured to emit a probe optical signal at the photodetector. The detector also may include a probe photodetector configured to detect a probe optical signal from the photodetector, and a multi-core optical fiber including a plurality of cores, each core having a first end, and a second end. Each of the first ends of the plurality of cores may be coupled optically with the photodetector. A first set of the second ends of the plurality of cores may be coupled optically with the probe optical source, and a second set of the second ends of the plurality of cores may be coupled optically with the probe photodetector. The detector also may include a processor coupled to the probe photodetector and configured to bandpass filter an output of the probe photodetector, and identify the chemicals in the sample.

Another aspect is directed to a detector for identifying chemicals in a sample. The detector may comprise a pump optical source configured to emit a pump optical signal into the sample, the pump optical signal having a known modulation, a known phase, and a known angle of incidence to the sample. The detector also may include a photodetector comprising SiC semiconductor material and configured to have an acceptor energy band of range $E_a-\Delta E_a$ to $E_a+\Delta E_a$, and the SiC semiconductor material may be doped with a dopant to exceed a threshold dopant concentration level. The photodetector may be configured to receive fluorescence information from the sample, the fluorescence information having the known modulation. The detector also may include a probe optical source configured to emit a probe optical signal at the photodetector. The detector also may include a probe photodetector configured to detect a changed probe optical signal from the photodetector, and a processor coupled to the probe photodetector and configured to identify the chemicals and respective distances in the sample based upon a phase shift in the changed probe optical signal.

Another aspect is directed to a detector system for identifying chemicals in a sample. The detector system may comprise a directional device, and a detector coupled to the directional device. The detector may include a pump optical source configured to emit a pump optical signal into the sample, the pump optical signal having a known modulation, a known phase, and a known angle of incidence to the sample. The detector also may include a photodetector comprising SiC semiconductor material and configured to have an acceptor energy band of range $E_a-\Delta E_a$ to $E_a+\Delta E_a$, and the SiC semiconductor material may be doped with a dopant to exceed a threshold dopant concentration level. The photodetector may be configured to receive fluorescence information from the sample, the fluorescence information having the known modulation. The detector may include a probe optical source configured to emit a probe optical signal at the photodetector, a probe photodetector configured to detect a changed probe optical signal from the photodetector, and a processor coupled to the probe photodetector. The processor may be configured to identify the chemicals and respective distances in the sample based upon a phase shift in the changed probe optical signal, and provide a time based three-dimensional model of the sample based upon a known position from the directional device. The processor may be configured to scan a given sample area and provide a time based three-dimensional model of the sample in relation to time to detect variances of chemical concentration measured by angle, distance and time.

The detector will be able to measure initial detection (if not already present), growth (angle & distance—or position) and/or dissipation in relation to time. Derivatives of changes note velocity and acceleration of sample movement. Velocity is listed below.

Other aspects are directed to a method for making a detector as described above, and a method for operating the detector as described above.

Figure 2:
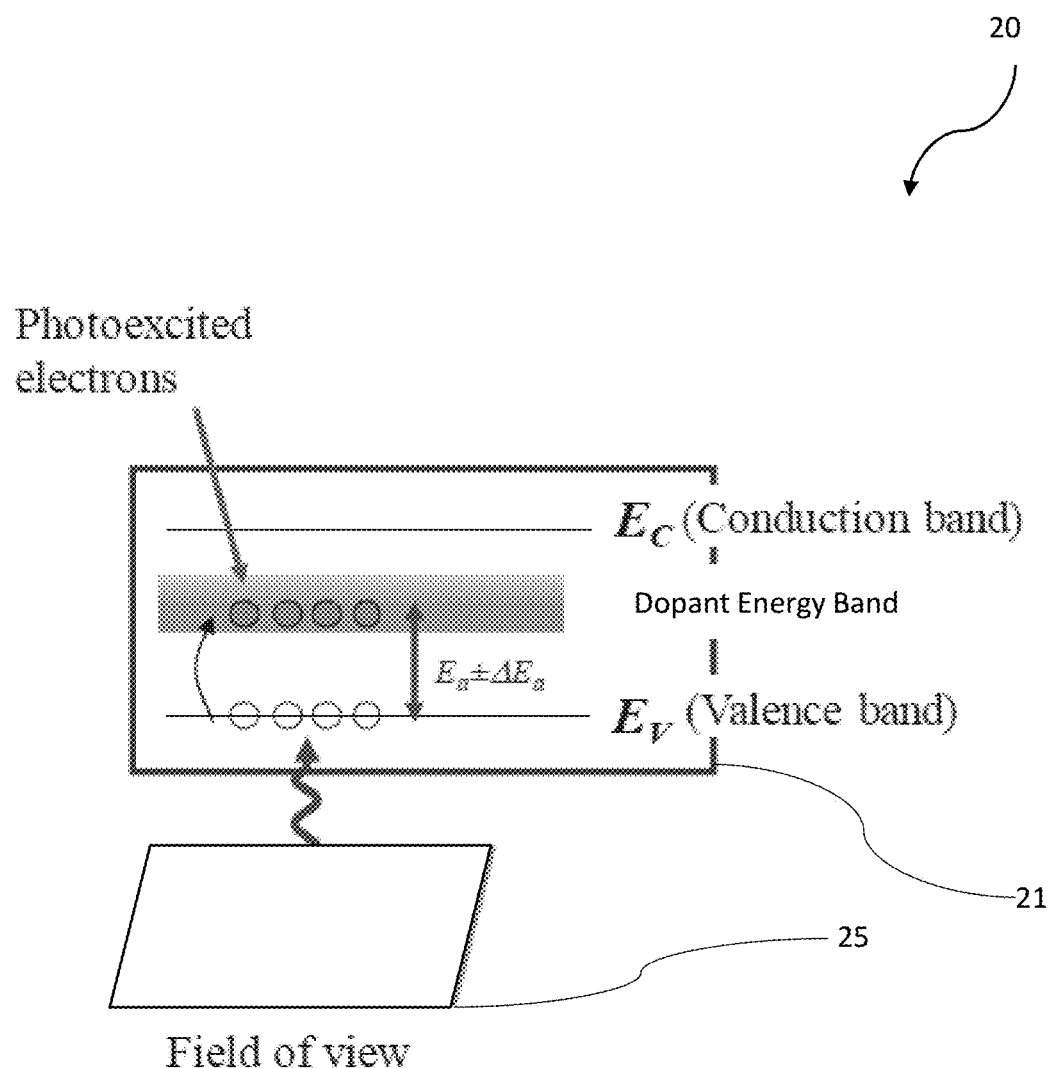
FIG. 2 is a schematic diagram of a SiC photodetector with a high dopant level, according to the present disclosure.

Referring to FIG. 2, a detector 20 is used for identifying chemicals in a sample 25. The sample 25 may comprise one or more of a gas sample, a fluid sample (e.g. aqueous solution), or a solid compound sample. The detector 20 illustratively includes a photodetector 21 comprising SiC semiconductor material and configured to have an acceptor energy band of range $E_a-\Delta E_a$ to $E_a+\Delta E_a$. As will be appreciated, this energy band of range can vary so as to capture the change in velocity of the sample and thermal shift. The SiC semiconductor material is doped with a dopant (e.g. N-type or P-type dopant) to exceed a threshold dopant concentration level. In particular, the threshold dopant concentration level comprises a level within the hyperdoping range. As will be appreciated, the hyperdoping range depends on the reflectivity of the SiC semiconductor material, which drives the dopant concentration (i.e. greater reflectivity provides for greater dopant concentration). The detector 20 also includes the photodetector configured to receive fluorescence information from the sample 25.

As will be appreciated, the detector 20 may be used in a number of applications. For example, the detector 20 may be used to monitor air quality in an air supply system within an aircraft. Another aspect is directed to an aircraft or underwater vehicle comprising an air supply system, and the detector 20 coupled to monitor the air supply system.

Figure 3:
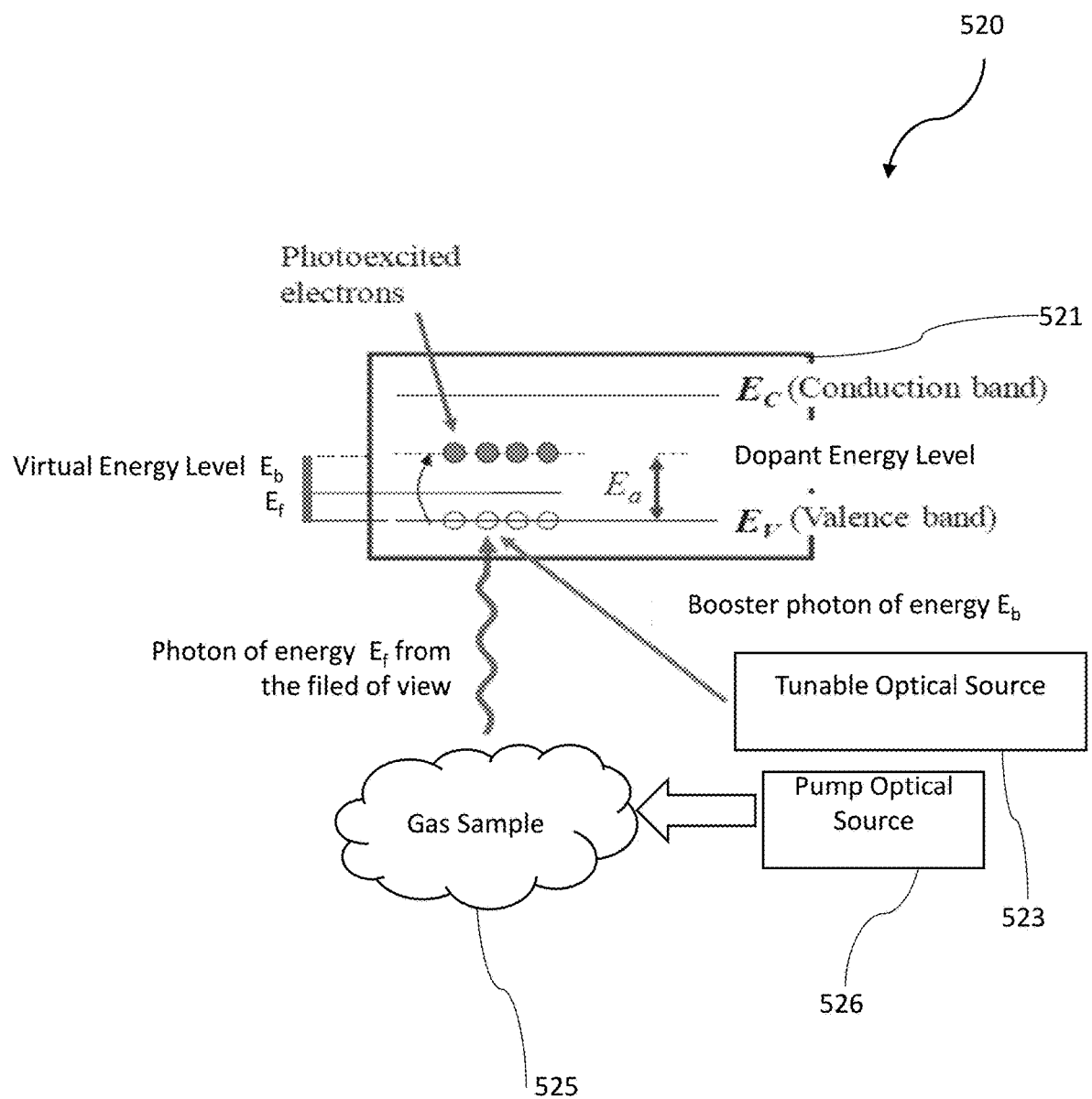
FIG. 3 is a schematic diagram of a first embodiment of a detector, according to the present disclosure.

Referring now additionally to FIG. 3, another embodiment of the detector 520 is now described. In this embodiment of the detector 520, those elements already discussed above with respect to FIG. 2 are incremented by 500 and most require no further discussion herein. This embodiment differs from the previous embodiment in that this detector 520 illustratively includes a pump optical source 526 configured to emit a pump optical signal into the sample 525, the pump optical signal having a known modulation. In particular, the known modulation may comprise a known waveform (e.g. a stepped waveform, a stepped chirp waveform, a triangular waveform, an oscillator waveform, or a sinewave waveform). For example, the pump optical source 526 may comprise a laser optical source (e.g. Helium Neon laser), an light emitting diode (LED), or a flash lamp.

The detector 520 also includes a photodetector 521 comprising SiC semiconductor material and configured to have an acceptor energy band of range $E_a-\Delta E_a$ to $E_a+\Delta E_a$. The SiC semiconductor material is doped with a dopant to exceed a threshold dopant concentration level. The detector 520 also includes a tunable optical source 523 (e.g. laser optical source) configured to emit a boosting optical signal at the photodetector 521, which provides for flexibility in the gas compound being detected. In particular, the tunable optical source 523 is configured to change the acceptor energy band of range to detect a plurality of compounds in the sample. In other words, the detector 520 uses booster lasers built in to open the acceptor band to detect other chemicals. Helpfully, the detector 520 can target multiple chemicals within a solution/gas without requiring a detector for each constituent.

The modulation of the tunable optical source 523 is used to screen out background radiation. The background radiation is static and may excite the photodetector 521. This allows a higher signal to noise ratio for detection. To be clear, a signal that is of the same wavelength in the same environment that is being probed will be excluded because the device does did not stimulate them and excludes it from collection. The stimulated fluorescence will have the modulation signal imposed on it by the pump optical source 526.

Indeed, using the tunable optical source 523, the gas being detected can be changed in real-time. The photodetector 521 is configured to receive fluorescence information from the sample 525, the fluorescence information having the known modulation.

Figure 4:
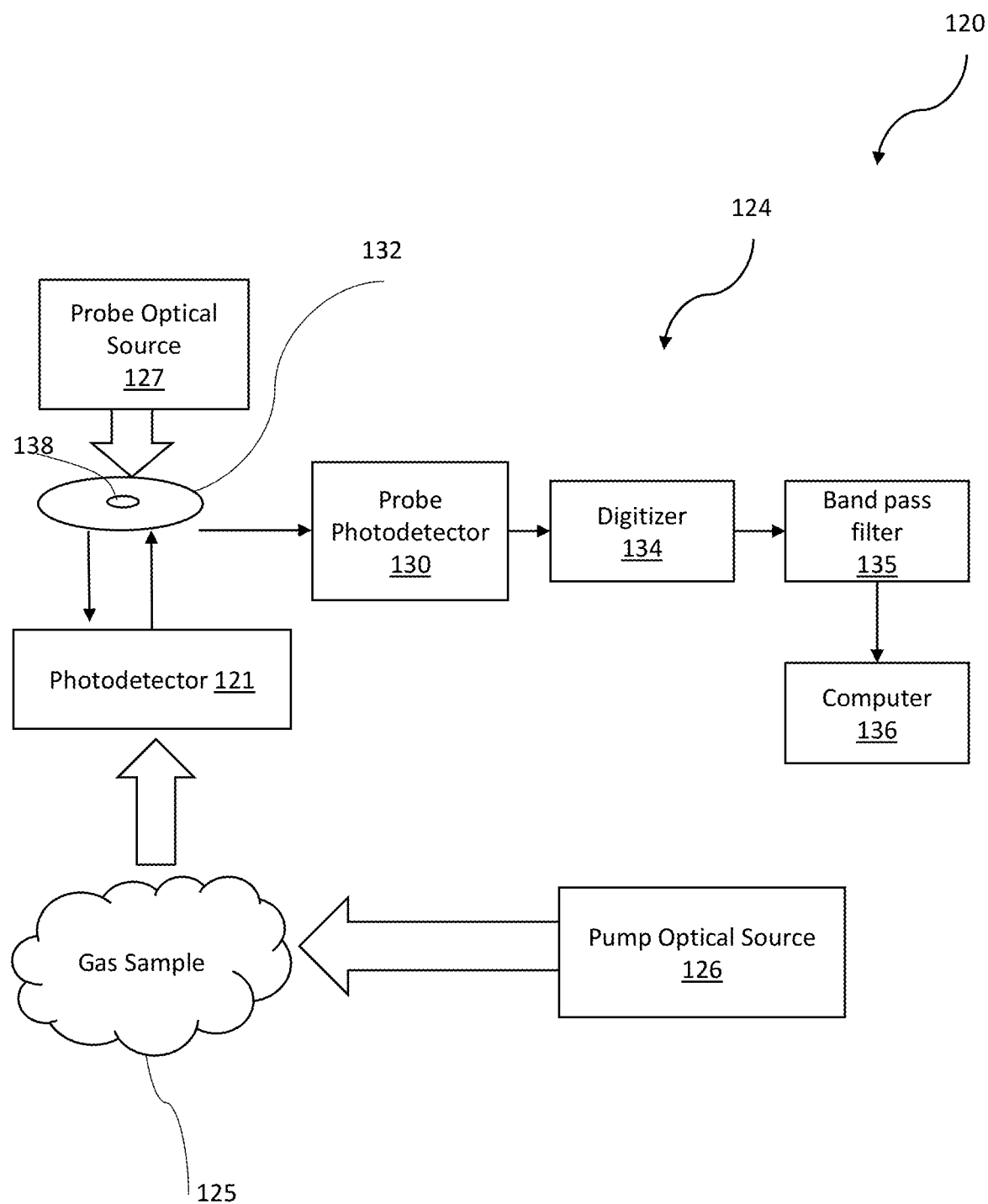
FIG. 4 is a schematic diagram of a second embodiment of the detector, according to the present disclosure.

Referring now additionally to FIG. 4, another embodiment of the detector 120 is now described. In this embodiment of the detector 120, those elements already discussed above with respect to FIGS. 2-3 are incremented by 100 and most require no further discussion herein. This embodiment differs from the previous embodiment in that this detector 120 illustratively includes a probe optical source 127 configured to emit a probe optical signal at the photodetector 121. For example, the probe optical source 127 may comprise a laser optical source.

The detector 120 illustratively includes a probe photodetector 130 (e.g. a photodiode, a charge coupled device (CCD), or an image sensor) configured to detect a changed probe optical signal from the photodetector 121. The detector 120 illustratively includes a mirror optical element 132 with a medial opening 138. The mirror optical element 132 permits the probe optical signal to pass through to the photodetector 121, and also reflects the changed probe optical signal into the probe photodetector 130.

The detector 120 illustratively includes a processor 124 coupled to the probe photodetector and configured to bandpass filter an output of the probe photodetector, and identify the chemicals in the sample 125. Helpfully, the processor 124 is configured to process the digital signal without the need for an amplifier. Here, the processor 124 illustratively includes a digitizer module 134 coupled downstream from the probe photodetector 130, a band pass filter module 135 downstream from the digitizer module, and a computer module 136 coupled downstream from the band pass filter module.

Figure 5A:
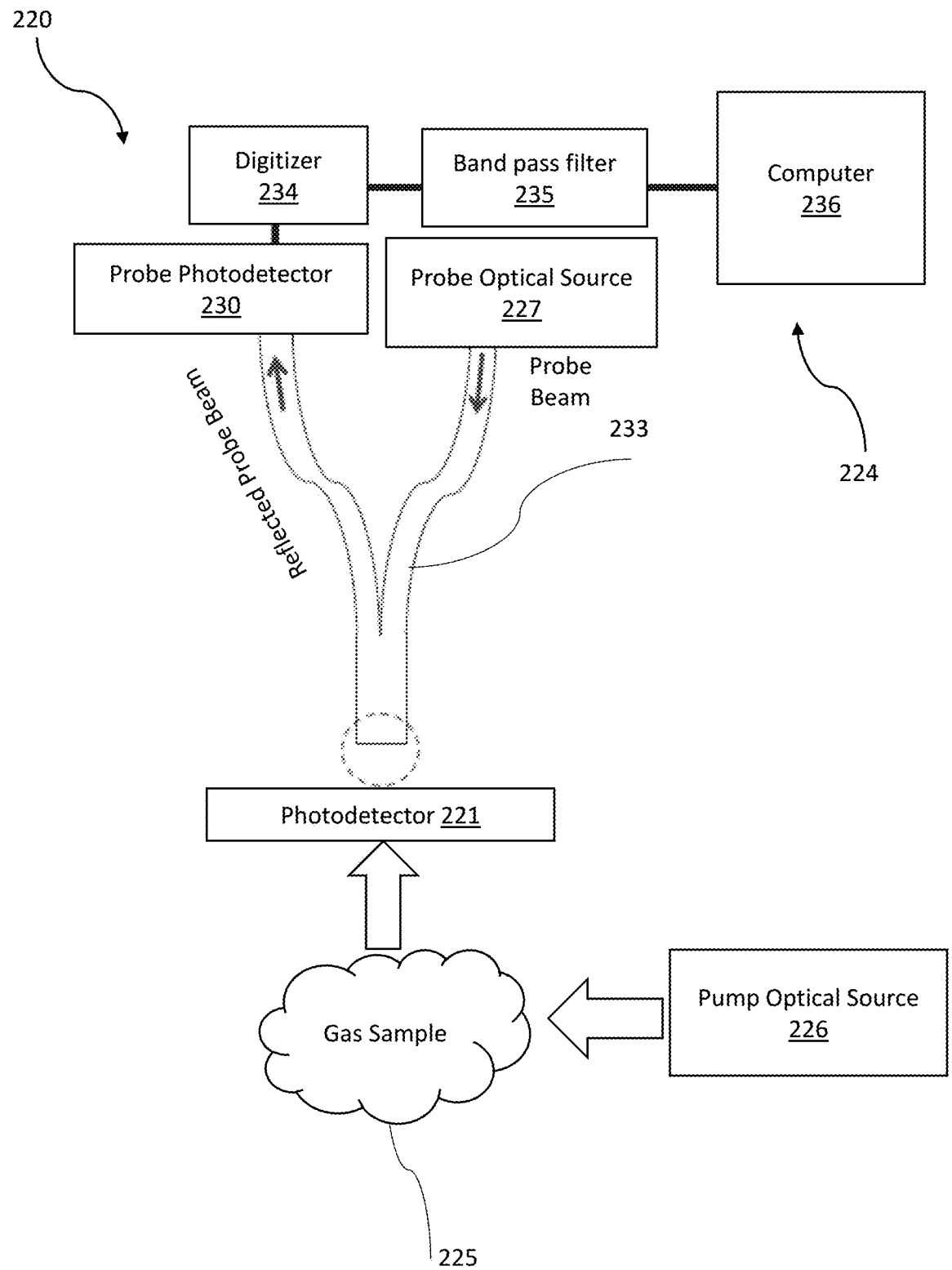
FIG. 5A is a schematic diagram of a third embodiment of a detector, according to the present disclosure.
Figure 5B:
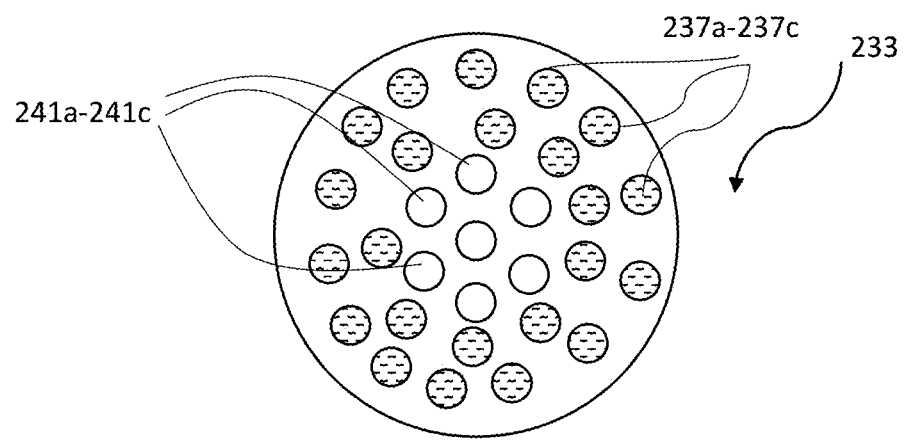
FIG. 5B is a schematic cross-sectional view of the multi-core optical fiber from the detector of FIG. 5A.
Figure 5C:
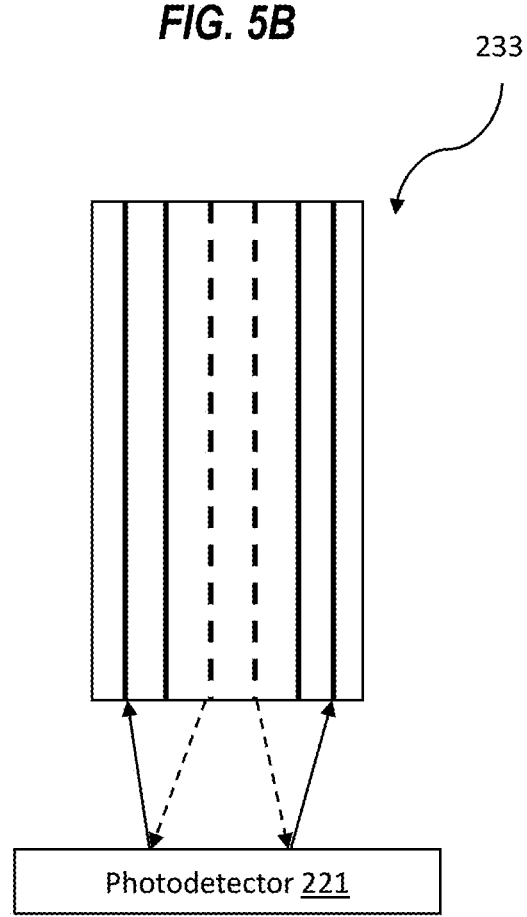
FIG. 5C is a schematic side view of the multi-core optical fiber and the photodetector from the detector of FIG. 5A.

Referring now additionally to FIGS. 5A-5C, another embodiment of the detector 220 is now described. In this embodiment of the detector 220, those elements already discussed above with respect to FIGS. 2-4 are incremented by 200 and most require no further discussion herein. This embodiment differs from the previous embodiment in that this detector 220 illustratively includes a probe photodetector 230 configured to detect a probe optical signal from the photodetector 221, and a multi-core optical fiber 233 coupled between the photodetector 221 at one end and the probe photodetector 230 and probe optical source 227 on at an opposite end.

As perhaps best seen in FIGS. 5B and 5C, the multi-core optical fiber 233 illustratively comprises a plurality of cores 237a-237c, 241a-241c, each core having a first end, and a second end. Each of the first ends of the plurality of cores 237a-237c, 241a-241c is coupled optically with the photodetector 221. A first set 241a-241c of the second ends of the plurality of cores is coupled optically with the probe optical source 227, and a second set 237a-237c of the second ends of the plurality of cores is coupled optically with the probe photodetector 230.

Referring now additionally to FIGS. 7A-7D, another embodiment of the detector 320 is now described. In this embodiment of the detector 320, those elements already discussed above with respect to FIGS. 2-5C are incremented by 300 and most require no further discussion herein. This embodiment differs from the previous embodiment in that this detector 320 illustrates a method to determine the distance of a chemical cloud using the phase shift or time shift between the waveforms of the pump and probe lasers 326, 327. The detector 320 includes a beam splitter 331 between the probe optical source 327 and the photodetector 321. The pump optical source 326 and the photodetector 321 are arranged in such a way that the pump photons travel a distance d from the pump optical source to a point on the chemical cloud and the photons, which are emitted by the sample 325, also travels the same distance d from the cloud to the photodetector.

The total time shift Δt includes the following three time shifts:

$$\Delta t = \Delta t_c + \Delta t_{SiC} + \Delta t_p;$$

$\Delta t_c$=Response time of the chemical, i.e., the time taken by the chemical to emit characteristic photons after the pump laser (pump optical source 326) begins to irradiate the chemical; $\Delta t_{SiC}$=Response time of the photodetector 321; and $\Delta t_p$=Response time of the probe beam detector 330.

The detector 320 measures Δt while operating the SiC detector system, and $\Delta t_{SiC}$ and $\Delta t_p$ are specified as characteristic performance data. Therefore, $\Delta t_c$ can be determined from the above equation. Also, the time difference between the time at which the optical signal appears on the probe beam display system and the time at which the pump beam is turned on is measured, and this time difference is denoted by t. So, the time taken by the photons to travel the distance 2d is t-$\Delta t_c$, and the distance d can be calculated using the following equation: $d=c(t-\Delta t_c)/2$; where c is the speed of light.

Diagram 81 shows the pump optical signal from the pump optical source 326. Diagram 82 shows the probe optical signal after interaction with the photodetector 321, and Diagram 83 shows the time delay between the signals.

Figure 7A:
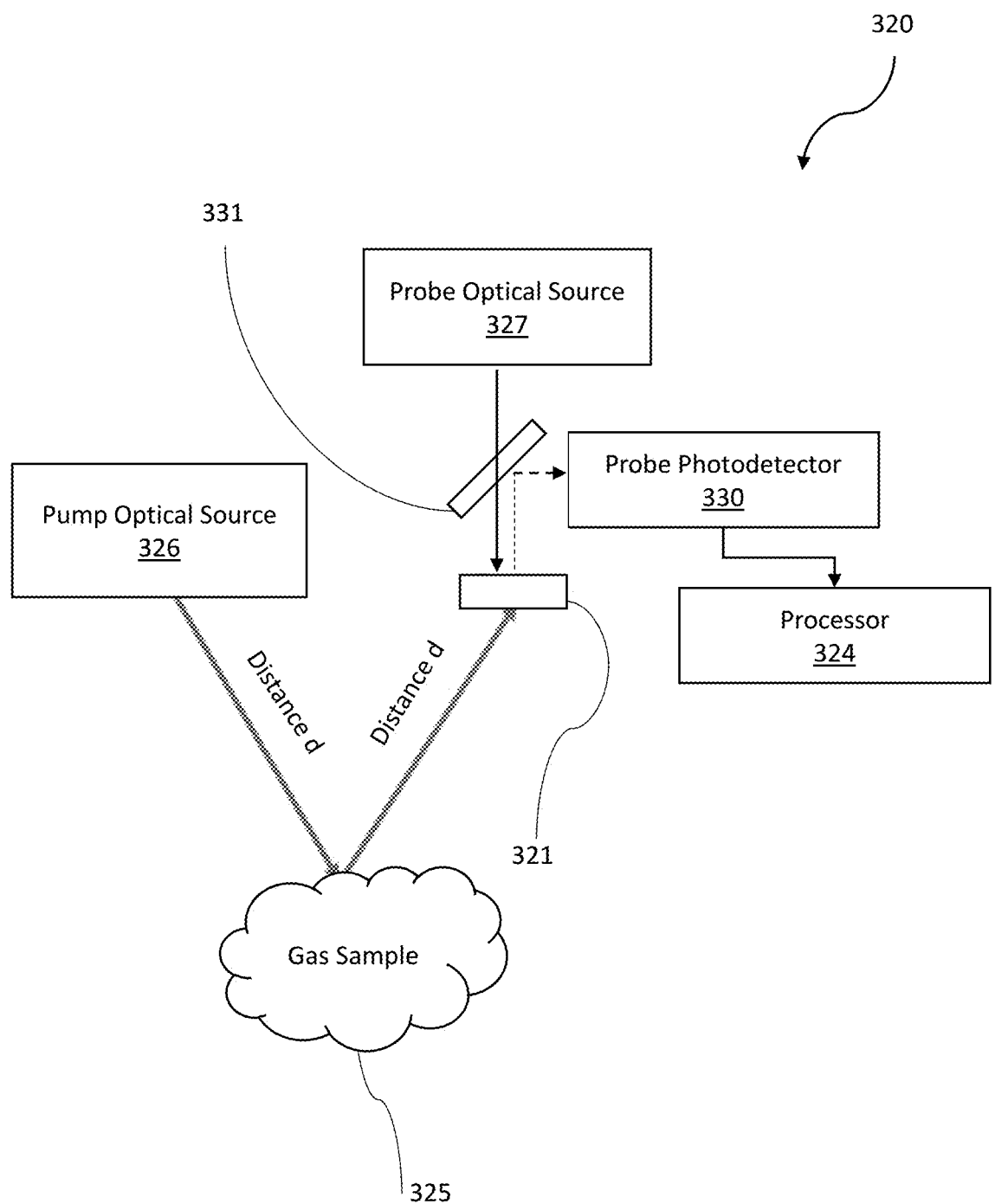
FIG. 7A is a schematic diagram of a fourth embodiment of a detector, according to the present disclosure.
Figure 7B:
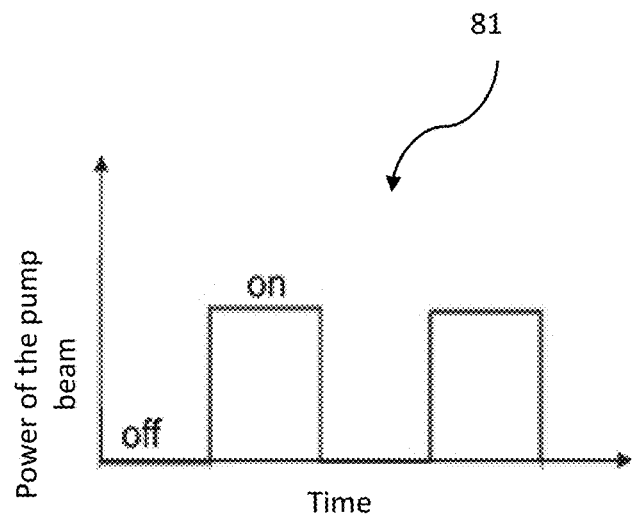
FIGS. 7B, 7C, and 7D are diagrams of the pump optical signal, the probe optical signal, and an overlay of the pump and probe optical signals, respectively, from the detector of FIG. 7A.
Figure 7C:
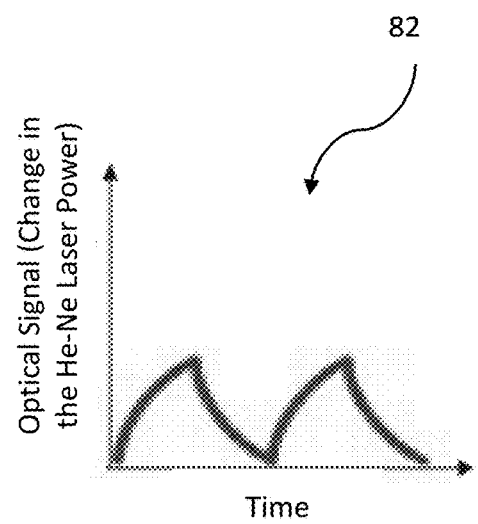
Figure 7D:
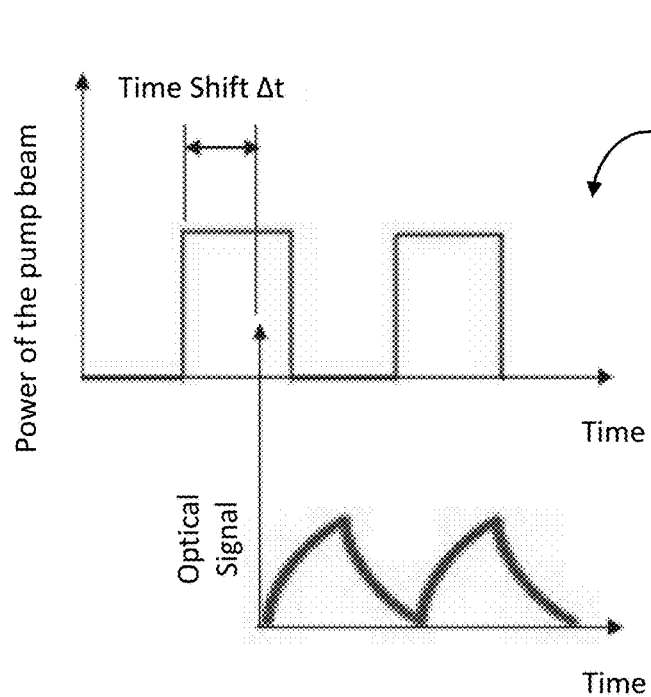
Figure 8:
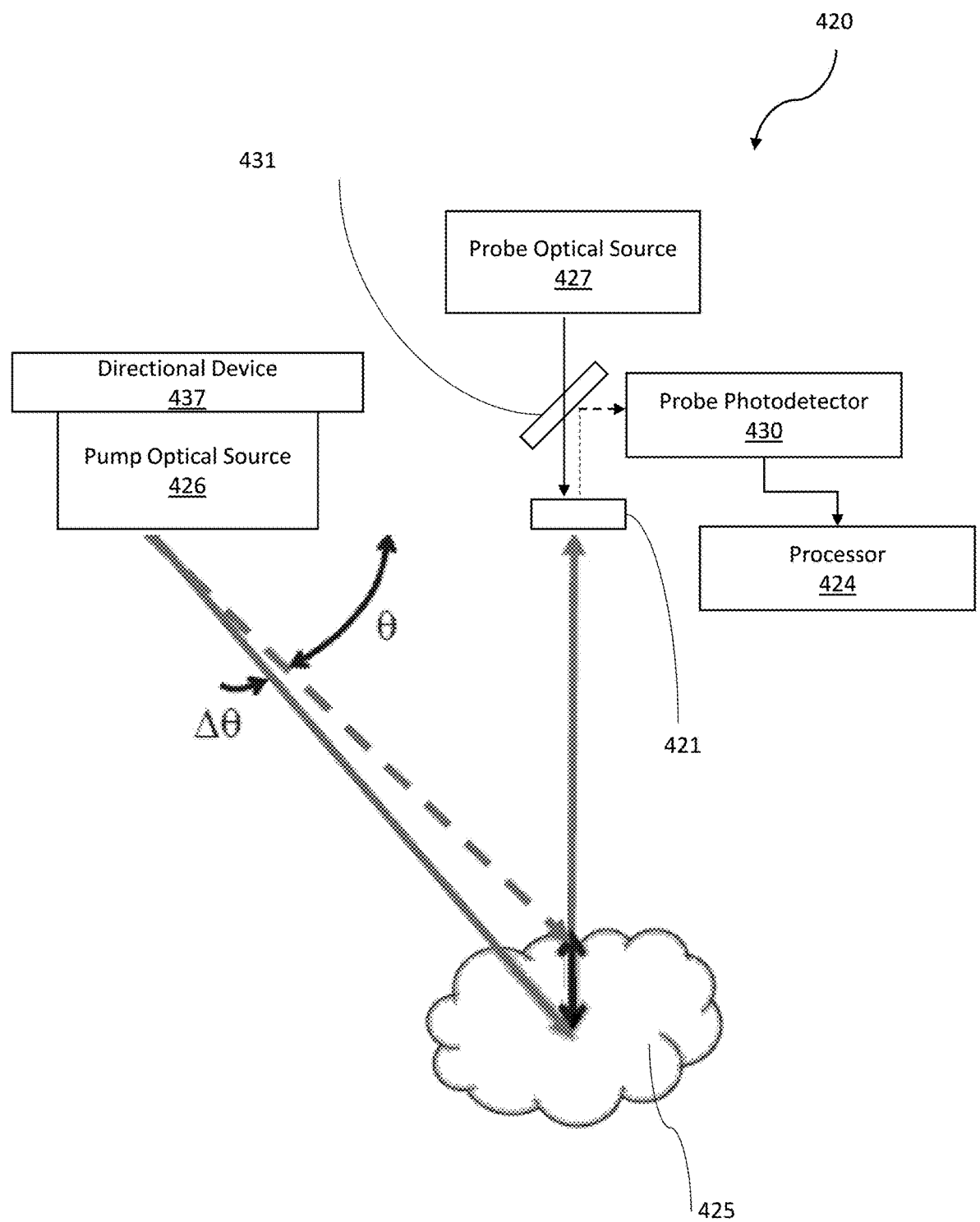
FIG. 8 is a schematic diagram of a fifth embodiment of a detector, according to the present disclosure.

Referring now additionally to FIG. 8, another embodiment of the detector 420 is now described. In this embodiment of the detector 420, those elements already discussed above with respect to FIGS. 2-5C & 7A-7D are incremented by 400 and most require no further discussion herein. This embodiment differs from the previous embodiment in that this detector 420 illustratively includes a pump optical source 426 configured to emit a pump optical signal into the sample 425, the pump optical signal having a known modulation, a known phase, and a known angle of incidence (θ) to the sample. The detector 420 illustratively includes a directional device 437 coupled to the pump optical source 426 and configured to control the known angle of incidence.

The detector 420 also includes a probe optical source 427 configured to emit a probe optical signal at the photodetector 421. The detector 420 illustratively includes a probe photodetector 430 configured to detect a changed probe optical signal from the photodetector 421, and a beam splitter 431 configured to pass the probe optical signal to the photodetector 421 and reflect the reflected probe optical signal. The detector 420 illustratively includes a processor 424 coupled to the probe photodetector 430 and configured to identify the chemicals and respective distances in the sample 425 based upon a phase shift in the changed probe optical signal.

Figure 10:
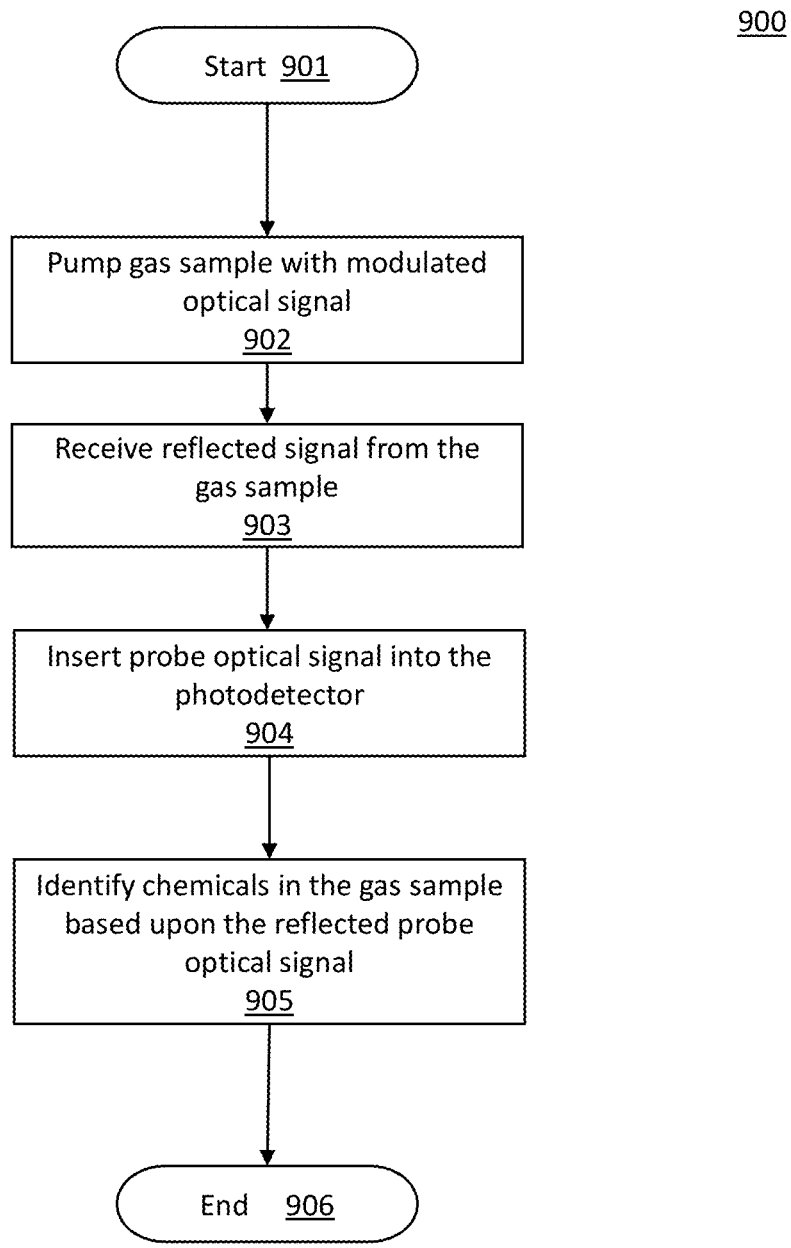
FIG. 10 is a method for operating an example embodiment of the detector, according to the present disclosure.

Referring now to FIG. 10 and a flowchart 900 therein, which begins at Block 901, a method for operating a detector 120, 220, 320, 420, 520 is now described. At Block 902, the method includes directing the pump optical signal into the sample. At Block 903, the method includes receiving a reflected optical signal from the sample at the photodetector. At Block 904, the probe optical signal is directed to the photodetector, and at Block 905, the method includes identifying chemicals in the sample. The method ends at Block 906.

Referring now briefly to FIG. 1, the detector disclosed herein is a new semiconductor structure based on the SiC using hyperdoping. When the SiC semiconductor material 800 is lightly doped with a p-type dopant, a discrete acceptor level 801 of energy $E_a$ is produced in the bandgap above the valence band (FIG. 1). Therefore, a photon of energy $E_a$ can be detected by this dopant energy level since only the photons of this particular energy will be able to excite electrons from the valence band to the dopant energy level to create photoexcited electrons.

On the other hand, if SiC is heavily doped (i.e. hyperdoped) with a p-type dopant, an acceptor energy band of range $E_a-\Delta E_a$ to $E_a+\Delta E_a$ is produced in the bandgap above the valence band (FIG. 2). The photons in this energy range can, therefore, excite electrons from the valence band to an energy level in this dopant energy band. Thus, the heavily doped SiC detector will enable detecting a large variety of chemicals that emit photons of energy $E_a \pm \Delta E_a$. With this broadened band gap semiconductor, the detector 120, 220, 320, 420, 520 disclosed herein can capture all the velocity classes of the chemical composition under investigation.

The dopant energy band in FIG. 2 provides a tunable mechanism to detect chemicals over a broad spectral range. In this mechanism, a filter is placed in front of the SiC detector to selectively allow photons of a particular energy in the range $E_a-\Delta E_a$ to $E_a+\Delta E_a$ pass through the filter to reach the detector.

In another embodiment, a tunable detector can be produced using the discrete energy level, i.e., the dopant energy level, in coordination with an external tunable laser (FIG. 3). In this design, the tunable laser acts as a booster laser to deliver the necessary photon energy $E_b$ to the desired photons for detection in the field of view. Within the detector 120, 220, 320, 420, 520 disclosed herein, a discrete dopant energy level $E_a$ in the SiC semiconductor material can be created, but the photons that need to be detected on the field of view may have insufficient energy $E_f$ to excite electrons from the valence band to the dopant energy level. Under these circumstances, the booster laser is used to produce photons of energy $E_b$ such that $E_f+E_b=E_a$ and, therefore, the field and booster photons together can excite the electrons from the valence band to the dopant energy level to produce an optical signal from the SiC detector.

If there is a chemical compound, the way the elements are arranged in the compound are fixed. They are fixed in place by physical principles governed by quantum mechanics and chemistry. Below, a chart shows how the bonds are formed for different compound and these bonds are very specific in the geometrical arrangement. Though, the two organic compound have the same double bond with oxygen they have two very different emission spectra.

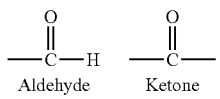

Chart 1

From this perspective, chemical compounds are viewed as Linear Time Invariant (LTI) systems. LTI simply means that the system would be exactly same at Standard Temperature Pressure (STP) anywhere within the world.

Typically, the detector 120, 220, 320, 420, 520 disclosed herein may not operate in a STP environment, therefore provisions have to made to accommodate the spectral broadening of the emission from compounds and having a broad interband semiconductor will accomplishes this. This device will receive the stimulated emission spectra from a compound under investigation with an induced modulate waveform generated from a pump laser. The modulated signal will induce stimulated modulated emission spectra from the compound. With that stimulated modulated spectra, a modulated power is induced onto the photodetector via the probe source. Then, the modulated signal can be extracted from the detector output, and the peak to peak amplitude can be measured. From the peak to peak amplitude, the user can then quantify how much of the chemical compound is present. The first method for collecting a signal is depicted in FIG. 4.

Referring now to FIGS. 5A-5C, the second method for collecting signal from the field of view. In this method, a double core optical fiber 233 is used to read out the optical signal from the photodetector 221 (SiC). The probe beam propagates towards the photodetector 221 through the central core of the fiber 233, and this beam is reflected off the SiC surface. The reflected probe beam propagates towards the probe photodetector 230 through the outer core of the optical fiber. The probe beam can be a He—Ne laser beam of wavelength 632.8 nm, or a light emitted by a light-emitting diode (probe optical source 227) or a light emitted by a laser diode. The probe photodetector 230 can be a Si photodiode.

Figure 6:
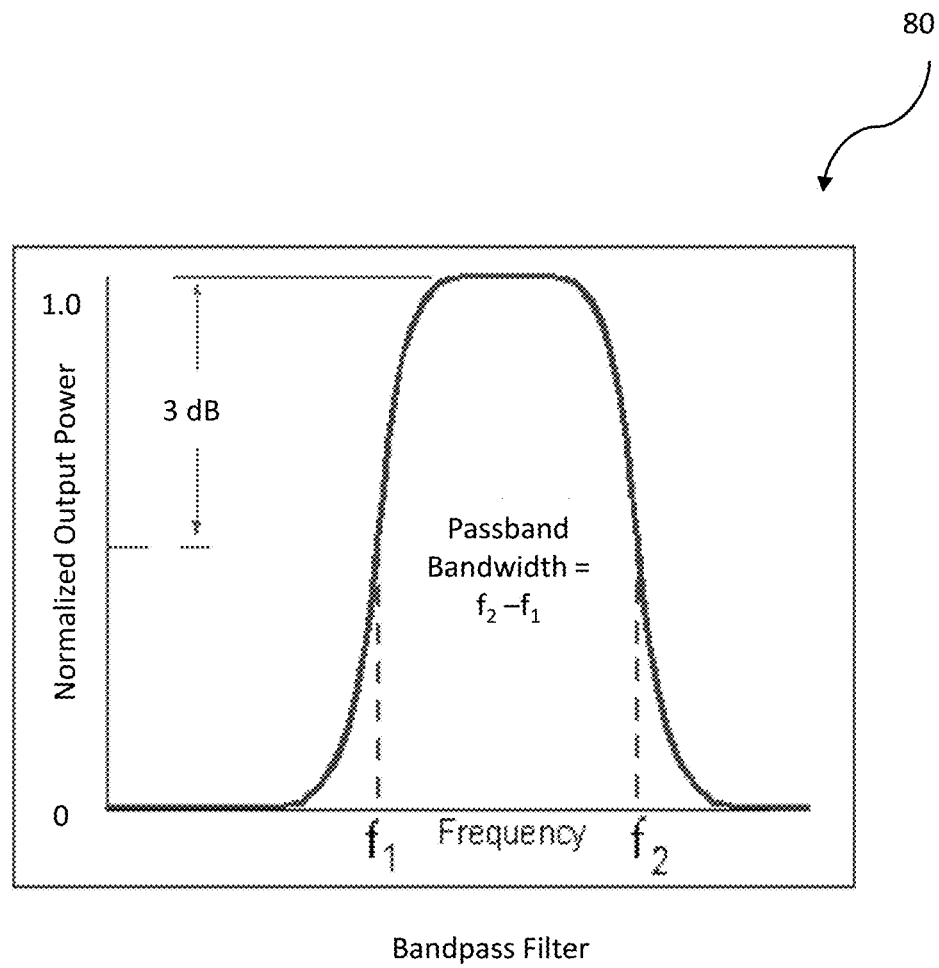
FIG. 6 is a diagram of a band pass filter in an example embodiment of the detector, according to the present disclosure.

With the modulation on the received signal, the user can bandpass filter (Diagram 80, FIG. 6) out the desired characteristic signal because of selective choosing of the modulation frequency. The bandpass filter will allow the user to select the passband bandwidth and therefore provide more flexibility in tweaking our Signal-to-Noise Ratio (SNR), thereby reducing detector error for false positive and more importantly detectability of the compound concentration.

Referring now to FIGS. 7A-8, it can be seen that phase information is giving the thickness of the cloud. FIG. 7A shows a detector 320 and a method to determine the distance of a chemical cloud using the phase shift or time shift between the waveforms of the pump and probe optical sources 326, 327. The detector 320 includes a beam splitter 331 between the probe beam and the photodetector 321. The pump laser system 326 and the photodetector 321 are arranged in such a way that the pump photons travel a distance d from the pump laser system to a point on the chemical cloud and the photons, which are emitted by the sample 325, also travels the same distance d from the cloud to the SiC detector.

The total time shift $\Delta t$ includes the following three time shifts:

$$\Delta t = \Delta t_c + \Delta t_{SiC} + \Delta t_p;$$

$\Delta t_c$=Response time of the chemical, i.e., the time taken by the chemical to emit characteristic photons after the pump laser (pump optical source 326) begins to irradiate the chemical;

$\Delta t_{SiC}$=Response time of the photodetector 321; and $\Delta t_p$=Response time of the probe beam detector 330.

The detector measures $\Delta t$ while operating the SiC detector system, and $\Delta t_{SiC}$ and $\Delta t_p$ are specified as characteristic performance data. Therefore, $\Delta t_c$ can be determined from the above equation. Also, the time difference between the time at which the optical signal appears on the probe beam display system and the time at which the pump beam is turned on is determined, and this time difference is denoted by t. So, the time taken by the photons to travel the distance 2d is $t-\Delta t_c$, and the distance d can be calculated using the following equation: $d=c(t-\Delta t_c)/2$; where c is the speed of light.

The distance between the SiC detector and the chemical cloud can also be determined by considering a right-angled triangle configuration ABC or ABD as illustrated in FIG. 8. In this configuration of the detector 420, the pump laser system (pump optical source 426) and the photodetector 421 are situated on a horizontal platform at a known distance apart AB, and the SiC detector collects photon flux from the cloud in the vertical direction such as AC, and the pump laser irradiates the could at an angle $\theta$ or $\theta-\Delta\theta$. So, the distance of a point C on the chemical cloud is given by AC=AB tan $\theta$. Similarly, the distance inside the cloud is given by AD=AB tan $(\theta+\Delta\theta)$.

FIG. 8 also illustrates the method of determining the concentration of a chemical in the cloud. The photon flux emitted by a chemical, $I_c$, can be related to the concentration by the following expression in the linear regime:

$$I_c = KI_pC;$$

where K is a constant which is determined experimentally for each chemical; and $I_p$ is the pump photon flux and C is the concentration of the gas.

Since the photodetector 421 receives photon flux from the surface of the cloud, this shows as an example the method of determining the concentration at an interior point D in the cloud. If $I_{pD}$ and C are the pump photon flux and the concentration of the gas respectively at the point D, the photon flux $I_{cD}$ emitted by the chemical at D is given by $I_{cD}=KI_{pD}C$. However, some of these photons will be absorbed by the gas as the photons travel to the point C on the surface of the cloud.

The present disclosure uses the Beer-Lambert law as an example to determine the photon flux $I_{cC}$ at the point C, i.e., $I_{cC}=I_{cD}\exp(-\mu\sigma)$, where $\mu$ is the absorption coefficient which is determined experimentally for each chemical, and $\sigma$ is the distance DC. Using the above-mentioned method of distance measurement, $\sigma$ can be determined as $\sigma$=AB (tan $(\theta+\Delta\theta)$−tan $\theta$, and the photon flux $I_{cC}$ is determined from the optical response of the SiC detector. Therefore, $I_{cD}$ can be determined as $I_{cD}=I_{cC}\exp(\mu\sigma)$ and then the concentration at point D is given by the following equation:

$$C=I_{cC}\exp(\mu\sigma)/(KI_{pD}).$$

Figure 9A:
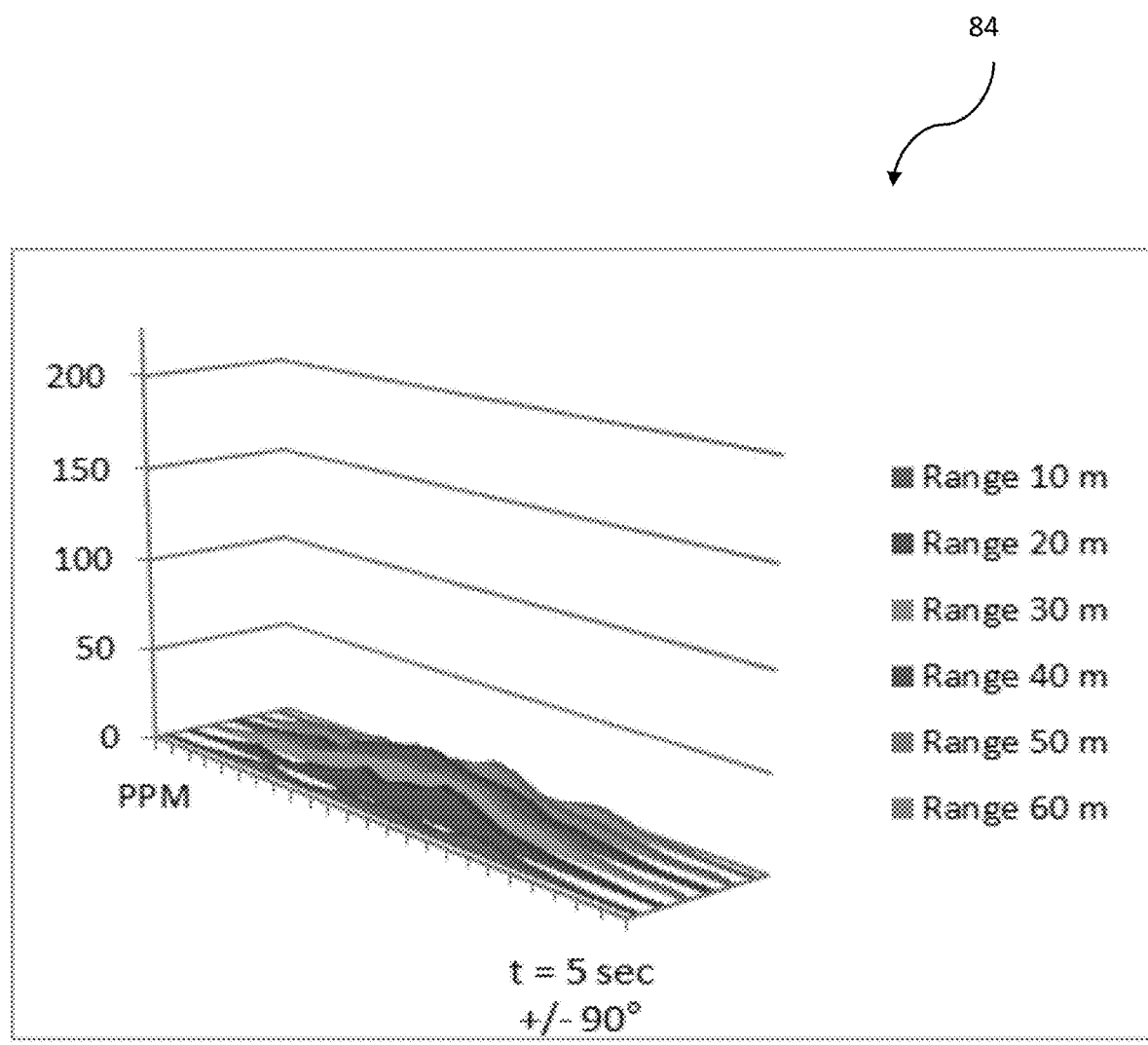
FIGS. 9A-9C are diagrams of photodetector performance in an example embodiment of the detector, according to the present disclosure.
Figure 9B:
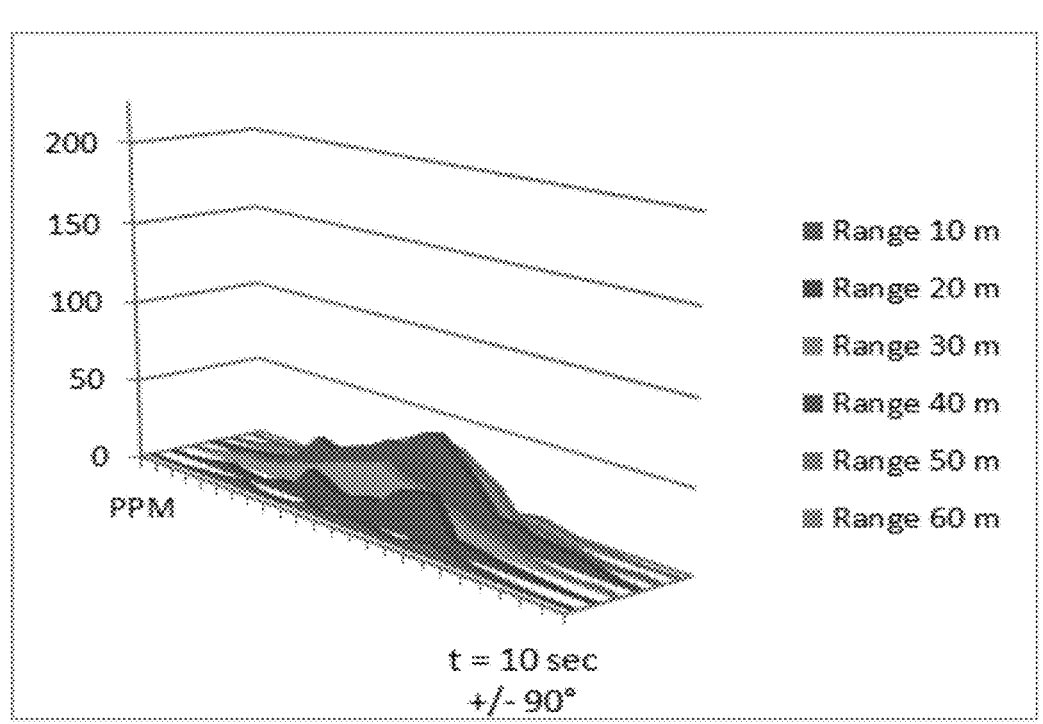
Figure 9C:
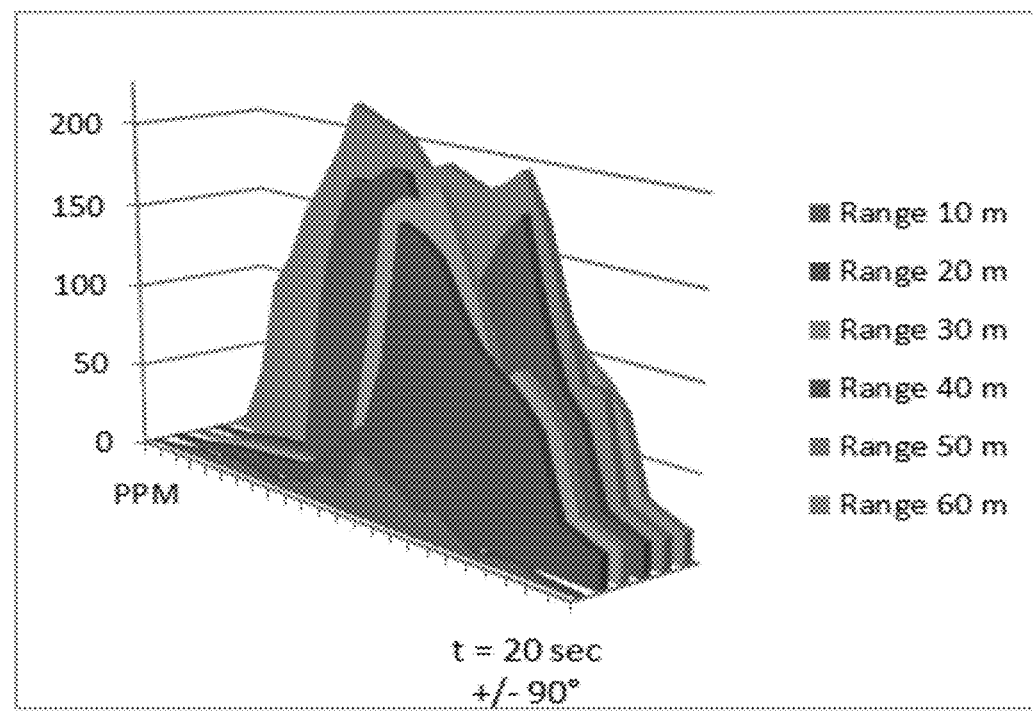

Referring now to FIGS. 9A-9C (Diagrams 84-86, ranges progressing from left to right, 10, 20, 30, 40, 50, 60 meters), due to the inherent capability for the technology to determine concentration and depth of the cloud, the extended application is to provide sensing in multiple dimensions including x, y and z scanning as well as time. The scanning capability could be accomplished through electro-mechanical means such as movement of the sensor system or making use of a scanning mirror, non-mechanical beam steering mechanisms or through employing an array of sensors. Any of these means could be used to provide the capability to scan and therefore map the volume and concentration of the gas in relation time.

By adding the time element to the scanning feature, the user could track the origination of the element of interest, the increase of the elemental concentration over time, i.e. the development of a gaseous cloud, and the migration of the gaseous cloud over time. Each of these measurements could be relevant depending upon the sensor application.

The detector 120, 220, 320, 420, 520 disclosed herein is capable of identifying a single compound in a mixture of other compounds. The detector 120, 220, 320, 420, 520 disclosed herein is can provide quantifying information, such as the concentration of the compound, the volume occupied by said compound and the location of the chemical cloud. In addition, with the use of time, the growth of concentration and migration of a changing gradient of concentration can be tracked.

Advantageously, the detector 120, 220, 320, 420, 520 herein provides a remote sensing capability, i.e., the chemical does not have to be in contact with the sensor. Using a remote pump laser, a user can stimulate the emission of the compound and the sensor can detect the emitted radiation from a stand-off distance. Since the optical sensor of this disclosure produces optical signal in contrast to conventional electrical sensors that produce current or voltage signal, the fabrication of the optical sensor is much simpler and cost-effective, and the sensor can be readily adapted to tunable detection for sensing multiple chemicals. The packaging cost is low since the optical sensor does not require any electrical contact. The read-out of the output signal of this optical sensor is accomplished with a probe laser beam or a light-emitting diode in contrast to the read-out integrated circuit of conventional electrical detectors and, therefore, the device of this disclosure is a wireless sensor. Since no bias voltage is applied to operate this sensor, the signal of the optical sensor does not have 1/f noise. The signal of conventional electrical detectors contains 1/f noise. The usage of a wide bandgap semiconductor to fabricate the optical sensor will make it an uncooled sensor that can operate at room temperature.

Additional advantages can be achieved if the optical sensor is made of crystalline SiC. Since SiC has high peritectic temperature, high elastic modulus and is also chemically inert with very high resistance to corrosion and oxidation, SiC optical sensors can be used in harsh environments such as high temperatures and pressures. High radiation hardness of SiC which makes it suitable for sensor applications in nuclear power reactors, e.g., submarine, and space. SiC can also be used as a medical sensor due to its good biocompatibility.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A detector comprising:
    a photodetector comprising silicon carbide (SiC) semiconductor material and configured to have an acceptor energy band of range $E_a-\Delta E_a$ to $E_a+\Delta E_a$;
    said SiC semiconductor material being doped with a dopant to exceed a threshold dopant concentration level, the threshold dopant concentration level causing the SiC semiconductor material to have the acceptor energy band of range $E_a-\Delta E_a$ to $E_a+\Delta E_a$; and
    said photodetector configured to receive fluorescence information from the sample.

2. The detector of claim 1 further comprising:
    a pump optical source configured to emit a pump optical signal into the sample, the pump optical signal having a known modulation; and
    a tunable optical source configured to emit a boosting optical signal at said photodetector;
    said photodetector configured to receive the fluorescence information from the sample, the fluorescence information having the known modulation; and
    said tunable optical source configured to change the acceptor energy band of range to detect a plurality of compounds in the sample.

3. The detector of claim 2 wherein said pump optical source configured to emit the pump optical signal into the sample, the pump optical signal having a known modulation, a known phase, and a known angle of incidence to the sample.

4. The detector of claim 2 wherein said pump optical source comprises an optical laser source.

5. The detector of claim 2 further comprising:
    a probe optical source configured to emit a probe optical signal at said photodetector;
    a probe photodetector configured to detect a changed probe optical signal from said photodetector; and
    a processor coupled to said probe photodetector and configured to bandpass filter an output of said probe photodetector, and identify chemicals in a sample.

6. The detector of claim 5 further comprising an optical beam splitter coupled between said probe optical source and said photodetector and said probe photodetector.

7. The detector of claim 5 wherein said probe photodetector comprises a photodiode.

8. The detector of claim 5 further comprising:
a multi-core optical fiber including a plurality of cores, each core having a first end, and a second end; and
each of the first ends of the plurality of cores being coupled optically with said photodetector, a first set of the second ends of the plurality of cores being coupled optically with said probe optical source, a second set of the second ends of the plurality of cores being coupled optically with said probe photodetector.

9. The detector of claim 8 wherein said processor is configured to identify chemicals and respective distances in a sample based upon a phase shift in the changed probe optical signal.

10. A detector system for identifying chemicals in a sample, the detector system comprising:
a directional device; and
a detector coupled to said directional device and comprising:
 a pump optical source configured to emit a pump optical signal into the sample, the pump optical signal having a known modulation, a known phase, and a known angle of incidence to the sample;
 a photodetector comprising silicon carbide (SiC) semiconductor material and configured to have an acceptor energy band of range $E_a-\Delta E_a$ to $E_a+\Delta E$;
 said SiC semiconductor material being doped with a dopant to exceed a threshold dopant concentration level, the threshold dopant concentration level causing said SiC semiconductor material to have the acceptor energy band of range $E_a-\Delta E_a$ to $E_a+\Delta E_a$;
 said photodetector configured to receive fluorescence information from the sample; the fluorescence information having the known modulation;
 a probe optical source configured to emit a probe optical signal at said photodetector;
 a probe photodetector configured to detect a changed probe optical signal from said photodetector; and
 a processor coupled to said probe photodetector and configured to
  identify the chemicals and respective distances in the sample based upon a phase shift in the changed probe optical signal, and
  provide a time based three-dimensional model of the sample based upon a known position from said directional device.

11. The detector system of claim 10 wherein said pump optical source comprises an optical laser source.

12. The detector system of claim 10 wherein said detector comprises an optical beam splitter coupled between said probe optical source and said photodetector and said probe photodetector.

13. The detector system of claim 10 wherein said probe photodetector comprises a photodiode.

14. A method of making a detector for identifying chemicals in a sample, the method comprising:
forming a photodetector comprising silicon carbide (SiC) semiconductor material and configured to have an acceptor energy band of range $E_a-\Delta E_a$ to $E_a+\Delta E_a$;
the SiC semiconductor material being doped with a dopant to exceed a threshold dopant concentration level, the threshold dopant concentration level causing the SiC semiconductor material to have the acceptor energy band of range $E_a-\Delta E_a$ to $E_a+\Delta E_a$; and
the photodetector configured to receive fluorescence information from the sample.

15. The method of claim 14 further comprising:
coupling a pump optical source configured to emit a pump optical signal into the sample, the pump optical signal having a known modulation; and
coupling a tunable optical source configured to emit a boosting optical signal at the photodetector;
the photodetector configured to receive the fluorescence information from the sample, the fluorescence information having the known modulation; and
the tunable optical source configured to change the acceptor energy band of range to detect a plurality of compounds in the sample.

16. The method of claim 15 wherein the pump optical source configured to emit the pump optical signal into the sample, the pump optical signal having a known modulation, a known phase, and a known angle of incidence to the sample.

17. The method of claim 15 wherein the pump optical source comprises an optical laser source.

18. The method of claim 15 further comprising:
coupling a probe optical source configured to emit a probe optical signal at the photodetector;
coupling a probe photodetector configured to detect a changed probe optical signal from the photodetector; and
coupling a processor to the probe photodetector and configured to bandpass filter an output of the probe photodetector, and identify the chemicals in the sample.

19. The method of claim 18 further comprising coupling an optical beam splitter between the probe optical source and the photodetector and the probe photodetector.

20. The method of claim 18 wherein the probe photodetector comprises a photodiode.

21. The method of claim 18 further comprising:
coupling a multi-core optical fiber including a plurality of cores, each core having a first end, and a second end; and
each of the first ends of the plurality of cores being coupled optically with the photodetector, a first set of the second ends of the plurality of cores being coupled optically with the probe optical source, a second set of the second ends of the plurality of cores being coupled optically with the probe photodetector.

22. The method of claim 18 further comprising coupling the processor to the probe photodetector and configured to compute sample characteristics in relation to time.

* * * * *